United States Patent
Price et al.

(10) Patent No.: US 8,891,579 B1
(45) Date of Patent: Nov. 18, 2014

(54) LASER DIODE APPARATUS UTILIZING REFLECTING SLOW AXIS COLLIMATORS

(75) Inventors: Kirk Price, Battle Ground, WA (US); Scott Lerner, Portland, OR (US)

(73) Assignee: nLIGHT Photonics Corporation, Vancouver, WA (US)

( * ) Notice: Subject to any disclaimer, the term of this patent is extended or adjusted under 35 U.S.C. 154(b) by 229 days.

(21) Appl. No.: 13/328,877

(22) Filed: Dec. 16, 2011

(51) Int. Cl.
*H01S 3/08* (2006.01)

(52) U.S. Cl.
USPC ............. 372/107; 372/92; 372/99; 372/50.12

(58) Field of Classification Search
CPC ....... H01S 5/40; H01S 5/4056; H01S 5/4031; H01S 5/42; H01S 3/0941; H01S 5/02252; H01S 3/0604; H01S 3/09408; H01S 3/094084; H01S 3/09415; H01S 5/4025
USPC .................... 372/107, 92, 99, 50.12
See application file for complete search history.

(56) References Cited

U.S. PATENT DOCUMENTS

| | | | |
|---|---|---|---|
| 4,828,357 A | 5/1989 | Arata et al. | |
| 5,319,528 A | 6/1994 | Raven | |
| 5,986,794 A | 11/1999 | Krause et al. | |
| 5,987,043 A * | 11/1999 | Brown et al. | 372/36 |
| 6,462,883 B1 | 10/2002 | Wang et al. | |
| 6,898,222 B2 * | 5/2005 | Hennig et al. | 372/36 |
| 7,733,932 B2 * | 6/2010 | Faybishenko | 372/36 |
| 7,751,458 B2 * | 7/2010 | Regaard et al. | 372/50.12 |
| 7,830,608 B2 * | 11/2010 | Hu et al. | 359/641 |
| 8,000,360 B2 * | 8/2011 | Faybishenko | 372/36 |
| 8,432,945 B2 * | 4/2013 | Faybishenko | 372/36 |
| 8,437,086 B2 * | 5/2013 | Du et al. | 359/629 |
| 2004/0114027 A1 * | 6/2004 | Frith | 347/243 |
| 2006/0165144 A1 * | 7/2006 | Mikhailov et al. | 372/50.12 |
| 2013/0148684 A1 * | 6/2013 | Guo et al. | 372/50.12 |
| 2013/0162956 A1 * | 6/2013 | Okuda | 353/30 |
| 2013/0194801 A1 * | 8/2013 | Wolf et al. | 362/241 |
| 2014/0036375 A1 * | 2/2014 | Chann et al. | 359/634 |

FOREIGN PATENT DOCUMENTS

| | | | |
|---|---|---|---|
| CN | 1829015 | * | 9/2006 |
| CN | 1975507 | * | 6/2007 |
| CN | 101141051 | * | 3/2008 |
| CN | 101144909 | * | 3/2008 |
| CN | 201113224 | * | 9/2008 |
| CN | 201515142 | * | 6/2010 |
| CN | 102074896 | * | 5/2011 |
| CN | 102437509 | * | 2/2012 |
| CN | 202548385 | * | 11/2012 |
| CN | 202720390 | * | 2/2013 |
| CN | 203071399 | * | 7/2013 |
| CN | 103368066 | * | 10/2013 |
| CN | 103401136 | * | 11/2013 |

\* cited by examiner

*Primary Examiner* — Colleen A Matthews
*Assistant Examiner* — Delma R Forde
(74) *Attorney, Agent, or Firm* — Ethan A. McGrath

(57) ABSTRACT

A laser diode apparatus including a mounting block, a plurality of diode lasers mounted to the mounting block and each capable of emitting a respective diode laser beam, and a plurality of cylindrical mirrors each having a reflective back surface for providing slow axis collimation of an incident diode laser beam via reflection off the back surface, each one of the plurality of cylindrical mirrors optically coupled to a respective diode laser of the plurality of diode lasers and optically oriented therewith so as to be capable of providing the diode laser beams in a stacked arrangement.

18 Claims, 3 Drawing Sheets

LASER DIODE APPARATUS UTILIZING REFLECTING SLOW AXIS COLLIMATORS

BACKGROUND OF THE INVENTION

1. Field of the Invention

Generally, the field of the present invention is laser diode apparatuses.

2. Background

The advent of the semiconductor diode laser has enabled significant advancement in a plethora of technological areas, including the industrial, consumer, and medical arenas.

Even before semiconductor diode lasers matured economically, the idea of producing an ultra-high power, ultra-high density laser beam was disclosed in U.S. Pat. No. 4,828,357 to Arata et al. Separate laser beams are reflected by respective mirrors to form a densely packed bundle of parallel beams or are directed to converge in a particular location. However, directing semiconductor diode lasers into a concentrated beam is significantly more complicated due to anomorphic beam characteristics of the constituent diode lasers, and the size scale and tolerances of the component parts required to fabricate the diode module. Moreover, since many diode modules are fiber-coupled, fiber characteristics such as acceptance angle and aperture size become additional constraints in the design of the module and component parts that provide light to the fiber.

The beam quality of laser diodes is almost diffraction limited with an $M^2$ value close to 1 in the plane perpendicular to the active region, while the beam quality of a broad area device in the plane parallel to the active region is relatively poor with an $M^2$ value typically around 20-30. Furthermore, dead-space between emitters in a laser diode bar array can reduce the $M^2$ to values of around 1000. This asymmetry in beam quality between the fast and slow axes is a primary challenge that needs to be overcome for the use of laser diodes in fiber coupled systems. This is typically achieved by rearranging the array of emitters in the slow axis and stacking them in the fast axis, resulting in a system with matched beam quality in the fast and slow axes.

For example, in U.S. Pat. No. 5,319,528 to Raven, a high power light source is disclosed that includes an array of laser diode modules optically coupled to a beam shaping and combining unit that has anomorphic prism pairs and that optically manipulates and directs beams to flat reflectors. The reflected beams are arranged in a stack that is directed to a focusing lens and subsequently coupled into an optical fiber. U.S. Pat. Nos. 7,733,932 and 8,000,360 to Faybishenko disclose an apparatus that includes a thermally dissipative body with stepped surfaces where upon each surface is mounted a laser diode structure emitting a laser beam parallel to the stepped surface, a slow axis collimation lens, and a beam reflecting turning mirror. Again the reflected beams are arranged in a stack that is directed to a focusing lens and subsequently coupled into an optical fiber.

In bar-based systems, the asymmetric beam quality in the fast and slow axes requires the use of expensive micro-optical beam shaping systems. These systems, which rotate the fast and slow axes of the individual emitters in the laser bar, are typically implemented with the use of step mirror arrays, arrays of micro-optical cylinder lens telescopes rotated by 45 degrees, or by lateral beam displacement techniques, such as those described in U.S. Pat. Nos. 5,986,794 and 6,462,883. While these systems are effective at rotating the optical axes, the optical to optical efficiency is diminished by multiple optical interfaces, imperfect beam rotation or stacking in the fast axis, and low brightness laser sources. The brightness of bar-based systems is further limited due to emitter cross heating and bar "smile." Cross heating increases the effective thermal resistance, forcing the individual emitters within the diode laser bar to run at lower power densities to maintain reasonable reliabilities. Bar smile introduces fast axis pointing error and optical defocusing, further diminishing the beam quality of the system.

Thus, although several laser diode module designs have emerged over the past few decades, a need remains for a laser diode apparatus that reduces the number of optics used in the optical system, so that a module may be provided that is simpler to manufacture and that can exhibit improved attendee preservation, while providing high-power low-divergence output.

SUMMARY OF THE INVENTION

The present invention satisfies the aforementioned need with a diode laser apparatus that includes collimating reflectors that both collimate and direct laser beams into a stacked arrangement. Thus, according to one aspect of the present invention a laser diode apparatus includes a mounting block, a plurality of diode lasers, each mounted to the mounting block and each capable of emitting a respective diode laser beam, and a plurality of collimating mirrors each for providing reflective slow axis collimation of an incident diode laser beam, each one of the plurality of collimating mirrors optically coupled to a respective diode laser of the plurality of diode lasers and optically oriented therewith so as to be capable of reflectively providing the diode laser beams in a stacked arrangement.

In one embodiment of the present invention the collimating mirrors are cylindrical mirrors with an anti-reflective front surface, a highly reflective back surface, and an interior region. The interior region allows an incident beam to refractivity propagate through the mirror to be reflected off the highly reflective back surface. In another embodiment the collimating mirrors are cylindrical mirrors that include a highly reflective front surface that reflect incident beams without substantial propagation through an interior region of the mirror. In either of these embodiments the collimating mirrors may include one or more aspheric surfaces for improved aberration correction.

Embodiments of the present invention allow for the collimation of laser diodes in the slow axis, while efficiently stacking the collimated single emitter devices in the fast axis. Pointing corrections are achieved by lateral displacement or rotation in the principal optical axis of the reflective slow axis collimation optic, and fast axis pointing error can be corrected by tilting the reflective slow axis collimation optic in the plane perpendicular to the diode laser active area (the fast axis).

The foregoing and other objects, features, and advantages will become more apparent from the following detailed description, which proceeds with reference to the accompanying figures.

DETAILED DESCRIPTION OF THE INVENTION

Figure 1:
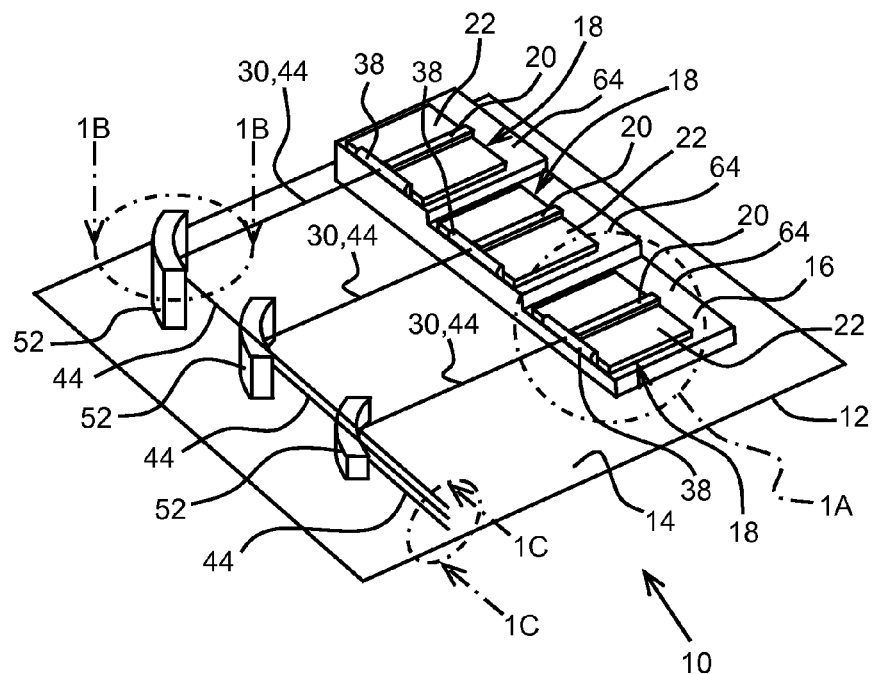
FIG. 1 is a perspective view of a first embodiment of the laser diode apparatus of the present invention.

In FIG. 1 a highly compact laser diode apparatus 10 of the present invention is shown in perspective. The apparatus 10 is fixedly attached to a housing 12 that includes a housing mounting surface 14. Attached or formed into the housing surface 14 is a mounting block 16 carrying diode laser structures 18 each including at least one diode laser 20, such as a single-emitter diode laser, mounted to a carrier plate 22. A diode laser structure 18 is shown enlarged in FIG. 1A for clarity. The diode laser 20 of diode laser structure 18 includes a laser cavity 26 and an emitting facet 28 for allowing optical loss from the resonant cavity 26 in the form of a laser beam 30 emitted therefrom. Semiconductor diode lasers 20 typically are grown on semiconductor wafer substrates such as GaAs or InP to form the laser cavity 26 in the shape of a parallelepiped, polyhedron, or other volumetric region. Suitable shapes of laser cavity 26 include a stripe-defined volume having a vertical facet dimension much smaller than a horizontal facet dimension, the horizontal dimension generally being parallel with the plane of the diode laser junction. An example of vertical and horizontal facet dimensions is 1-3 µm by 50-400 µm. The cavity length dimension is typically much larger, such as several hundred to several thousand microns. Because of the significant aspect ratio of facet 28 the emitted laser beam 30 is characterized by a fast axis 32 corresponding to the shorter facet dimension with high optical divergence and a slow axis 34 corresponding to the longer facet dimension with low optical divergence.

Emitted light with respect to the fast axis 32 diverges quickly in a diffraction limited manner due to the inverse proportionality of beam divergence angle and beam width at a particular wavelength. Because this divergence angle is large, it is generally preferred that a fast axis collimator 38 be positioned in close proximity to the emitting facet 28 and optically coupled to it. Suitable fast axis collimators 38 include lenses of a half-cylindrical configuration. The fast axis marginal rays 40, 42 of the beam 30 exiting the fast axis collimator 38 are parallel or close to a parallel relation with the principal ray 44 of beam 30. Slow axis marginal rays 46, 48 continue to diverge slowly past fast axis collimator 38. Thus, beam 30 propagates past fast axis collimator 38 in the form of a flattened and expanding cone 50 that is suitably collimated along the fast axis 32.

Figure 1A:
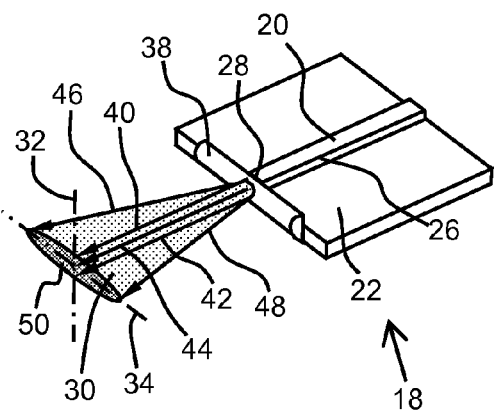
FIG. 1A is a close-up view of diode subassembly of the apparatus of FIG. 1.
Figure 1B:
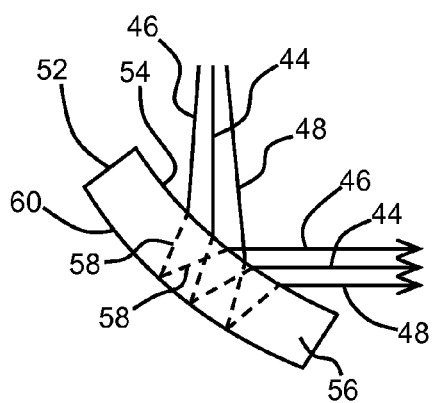
FIG. 1B is a top view of a lens mirror according to the first embodiment of the apparatus of the present invention.

Reference is now additionally made to FIG. 1B in conjunction with FIGS. 1-1A wherein an exemplary one of a plurality of cylindrical mirrors 52 is shown that provides slow axis collimation and reflective direction of an incident corresponding one of the diode laser beams 30. The top view of any one of the cylindrical mirrors 52 in FIG. 1B shows the principal ray 44 and slow axis marginal rays 46, 48 incident upon a first surface in the form of an anti-reflective coated front surface 54 of the mirror 52. Rays 44-48 are refracted through the interior 56 of the mirror 52 to become interior rays 58 (shown as hidden lines) and reflect off a second surface in the form of a high-reflection coated back surface 60. Upon exiting a third surface in the form of the front surface 54 of the mirror 52, rays 44-48 propagate parallel to each other in a collimated fashion. Thus, after mirror 52, beam 30 is collimated in both fast and slow axes 34, 36. In one configuration the surfaces 54, 60 are defined by two spherical radii, reducing the complexity and cost of the optics. The radius of curvature of the surfaces 54, 60 are chosen to correct for coma and spherical aberration. The three surfaces present a triplet optical design arranged in a positive—negative—positive configuration, decoupling the principal and marginal arrays, and allowing for the correction of spherical and comatic aberrations.

Mirrors 52 can be also aspheric in surface shape at one or both of the front and back surfaces 54, 60 so that the one or both surfaces do not have a surface profile directly proportional to spherical or cylindrical profiles. Mirrors 52 may be fabricated by various methods, including using a mold or by directly machining the surfaces of the mirror. Generally, the inclusion of mirrors 52 allows a decrease in the number of optical components required to reflect and collimate beams 30 when compared to conventional systems utilizing a cylindrical lens and reflecting mirror pair to accomplish the same.

Mirrors 52 also provide pointing correction of the incident laser beams 30 for along both the fast axis 32 and slow axis 34. The brightness preservation of an array of laser diodes is limited by the ability to collimate and point the array of lasers in precisely the same direction. The slow axis collimation reflective optics of the present invention can be used to provide precise collimation and pointing correction of the incident laser beams 30 so that the beams become optimally stacked in the fast axis 32. For example, mirrors 52 can be physically displaced along the optical axis, allowing for precise laser collimation in the slow axis 34. Individual control over each mirror 52 allows for precise collimation control. Lateral pointing error can be corrected for by rotating the mirror 52 or by physically displacing the mirror in the plane parallel to the emitting surface 28 of the diode laser 20. Also, tilting the reflective slow axis collimator 52 in the fast axis 32 can correct for fast axis pointing errors that are typically caused by displacement of fast axis collimator 38. Thus, instead of aligning multiple optics such as a lens and mirror pair and encountering misalignment and limited pointing correction associated therewith, embodiments of the present invention allow for more efficient pointing correction via rotational and displacement degrees of freedom of the collimating slow axis optics 52.

Figure 1C:
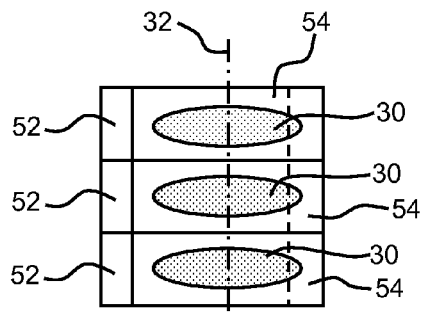
FIG. 1C is a side view of mirrors and output beams according to the first embodiment of the apparatus of the present invention.

Referring back to FIG. 1, mounting block 16 is shown to have a stepped arrangement forming separate adjacent step surfaces 64 of different heights. The laser diode structures 18 are fixedly mounted to the surfaces 64 and are arranged thereon so as to allow the diode lasers 20 to emit laser beams 30 horizontally and perpendicular to the direction of the stepped arrangement. Because of the height differential between stepped surfaces 64, the beams 30 are emitted from different heights. The mirrors 52 have a corresponding stepped height such that the laser beam 30 emitted from the laser diode structure 18 on the highest step surface 64 is incident on the mirror 52 with the largest height and each laser beam 30 emitted from a laser diode structure 18 on each subsequently lower step surface 64 is incident on each subsequently shorter mirror 52. Because each mirror 52 is shorter than the next, collimated beams 30 reflected from taller mirrors 52 may propagate over shorter adjacent mirrors 52 without substantially interacting therewith. In FIG. 1C a side view is shown of the mirrors 52 and collimated reflected beams 30. Because the collimated reflected beams 30 can pass above adjacent mirrors, a stack of collimated beams 30 is formed that is ready for subsequent optical manipulation.

Figure 2:
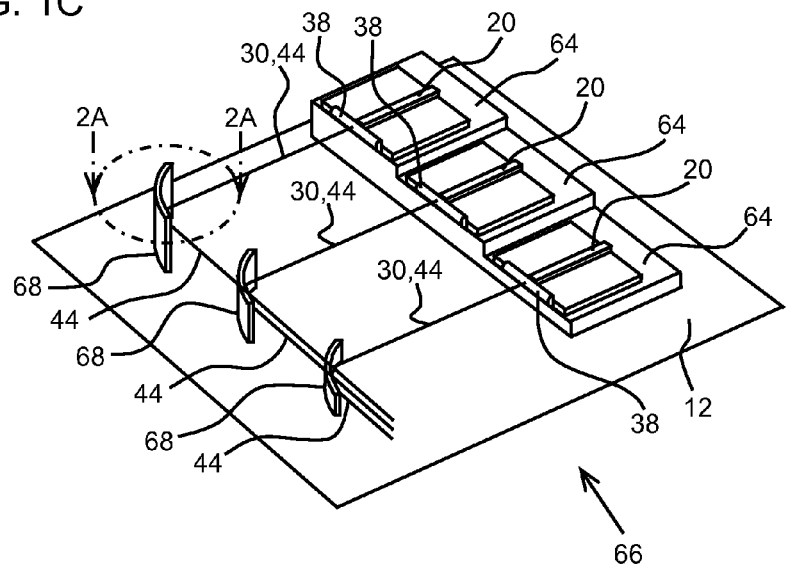
FIG. 2 is a perspective view of a second embodiment of the laser diode apparatus of the present invention.
Figure 2A:
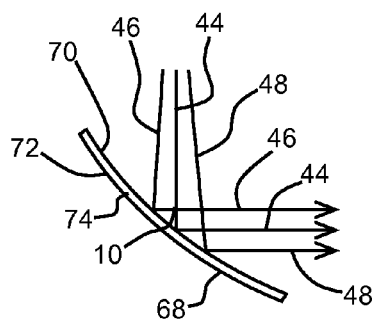
FIG. 2A is a top view of a lens mirror according to the second embodiment of the apparatus of the present invention.

In FIG. 2 a second embodiment of a laser diode apparatus 66 of the present invention is shown. Laser diode apparatus 66 includes all the components of the aforementioned described apparatus 10, however, different curved mirrors 68 replace the cylindrical mirrors 52 included in apparatus 10. Mirrors 68 are front-reflecting and preferably aspheric, though may be cylindrical, and are shown in greater detail in the top view of FIG. 2A. Mirrors 68 have front and back surfaces 70, 72, however front surface 70 is high-reflection coated so that an incident beam 30 does not refract through the interior 74 of the mirror 68. A front-reflecting aspheric mirror 68 not only reduces the number of optical surfaces required to reflect and collimate the incident beam 30 but also provides good correction for spherical and coma aberrations.

Figure 3:
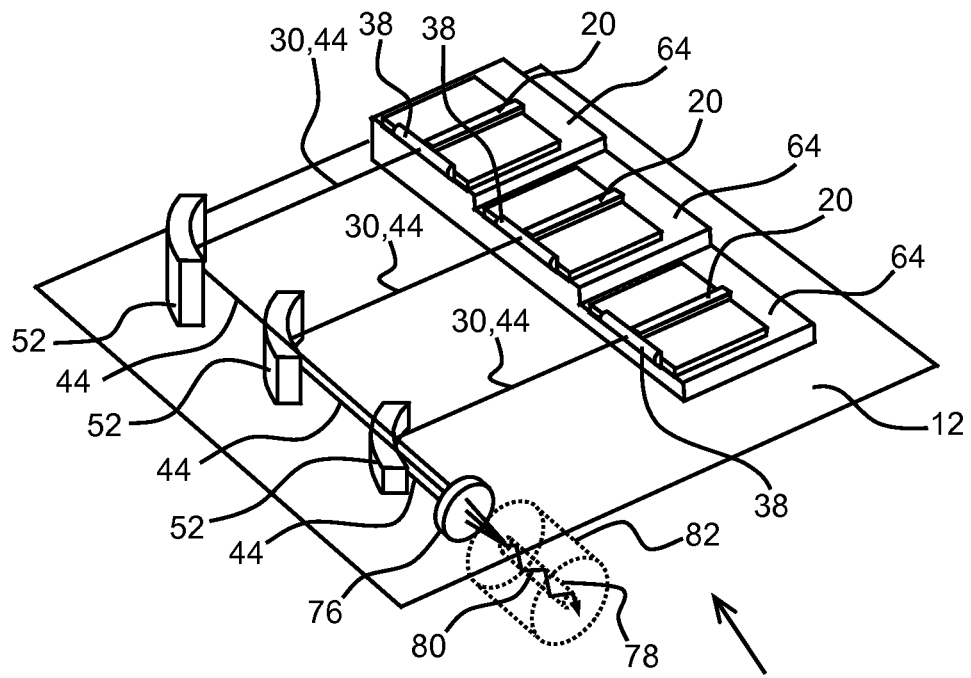
FIG. 3 is a perspective view according to a third embodiment of the laser diode apparatus of the present invention.

Referring now to FIG. 3, additional optical components are shown in relation to laser apparatus 10. A focusing optic 76 is optically coupled to the beams 30 after they are reflectively collimated by cylindrical mirrors 52. An optical fiber 78 is disposed after the focusing optic 76 and optically coupled to the optic 76. The stacked beams 30 are focused into the optical fiber 76 for internal propagation therethrough, as shown with representative internally reflected beam 80. The fiber 78 is typically disposed in a fiber ferrule 82 for effective coupling of the laser light out of the apparatus 10 for various applications and thereby forms a module output. Other outputs may be used, such as homogenization rods, or other optical elements. For example, the apparatus 10 may provide high energy pump light for various laser applications, such as for a fiber laser, fiber amplifier, or solid-state laser, or provide laser energy directly for materials processing or other applications. By combining reflective and collimation functions into a single set of optics, such as a cylindrical mirror arrangement, a significant reduction in cost of production and increase in manufacturing efficiency can be achieved.

Figure 4:
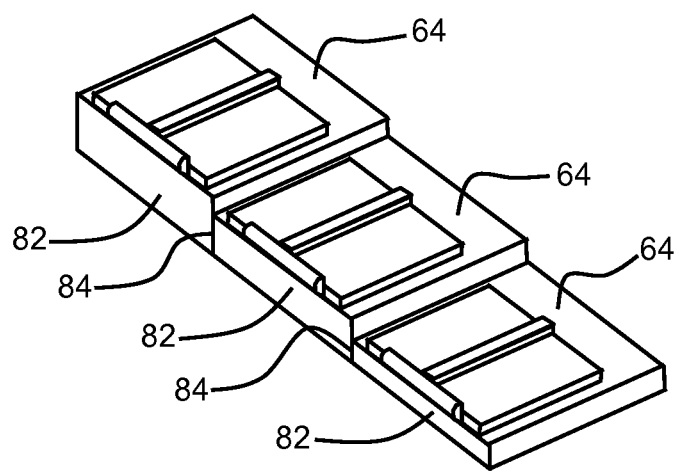
FIG. 4 is a perspective view of a mounting block according to a fourth embodiment of the apparatus of the present invention.

Various configurations of optical components of apparatus 10 are possible that provide similar functionality while still enabling a high brightness output in a highly efficient module. In some configurations, mounting block 16 providing a stepped arrangement can be constructed in other geometries and modularity. For example, as shown in FIG. 4, each stepped surface 64 may be defined by a separate block 82 and allowing each separate block 82 to be installed separately from each other to form mounting block 16. While separate blocks 82 may be installed so as to have adjoining surfaces 84, they may also be adjacent and separated by a distance. Moreover, mounting block 16 or blocks 82 may have other shapes beyond those shown in the various figures herein, such as circular, rectangular, etc. Installation of the mounting block 16 may be performed with epoxy or other adhesive as well as with mechanical fasteners. The separate blocks 82 can also have longer or varying lengths extending parallel to the beam propagation directions. Thus, the block 16 may extend so as to provide a surface for the collimating mirrors 52 to be mounted upon, and the diode laser structures 18 may be mounted in other than an adjacently parallel configuration. That is, one or more diode laser structures 18 may be offset forwards or rearwards with respect to the direction of beam propagation.

Each diode laser structure 18 may be more complex than a single single-emitter diode laser 20 mounted to a carrier plate 22. For example, a plurality of single-emitter diode lasers 20 may be mounted to the carrier plate 22 in an adjacently configuration. Alternatively, a modular assembly that includes a plurality of diode lasers 20 may be mounted to the housing mounting surface 14 and optically coupled with a respective mirror 52. In another example, different diode lasers are capable of emitting at different wavelengths. The number of diode laser structures 18 and the stepped arrangement may also be increased or decreased, along with the corresponding mirrors 52, to increase or decrease the number of beams 30 stacked along the fast axis 32. The mounting block 16 is generally made from a heat dissipative material, such as copper or aluminum, or an alloy thereof. Due to the large amount of heat generated by the high power diode lasers 20, the apparatus 10 and housing 12 are typically cooled with a thermoelectric cooler or other cooling mechanism.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A laser diode apparatus comprising:
a mounting block;
a plurality of diode lasers, each mounted to said mounting block and each capable of emitting a respective diode laser beam; and
a plurality of mirrors each for providing slow axis collimation and reflective direction of an incident corresponding one diode laser beam, each one of said plurality of mirrors optically coupled to at least one respective diode laser of said plurality of diode lasers and optically oriented therewith so as to be capable of reflectively providing the diode laser beams in a stacked arrangement;
wherein each of said mirrors is capable of providing slow axis and fast axis pointing correction of the respective diode laser beams via rotation, displacement, or rotation and displacement of said each mirror with respect to one or more axes associated therewith or associated with the respective diode laser beams.

2. The apparatus of claim 1 wherein each of said mirrors is made with two curved spherical or aspherical surfaces, providing three effective surfaces for spherical and comatic aberration correction.

3. The apparatus of claim 1 wherein each of said mirrors includes a highly reflective front surface.

4. The apparatus of claim 1 wherein each of said mirrors includes a front surface having an aspheric shape.

5. The apparatus of claim 1 wherein the stacked arrangement is aligned with a fast axis of the diode laser beams such that the laser beams point in the same direction in the fast axis.

6. The apparatus of claim 1 wherein said mounting block includes a plurality of adjacent flat mounting surfaces wherein each corresponding one of said plurality of diode lasers is mounted thereon, each one mounting surface of said plurality of mounting surfaces being vertically stepped with respect to each one adjacent mounting surface in a direction laterally perpendicular to the emission direction of said plurality of diode lasers.

7. The apparatus of claim 6 wherein the stacked arrangement of diode laser beams has a beam order corresponding to the order of said plurality of diode lasers mounted to said plurality of mounting surfaces.

8. The apparatus of claim 1 wherein said mounting block is heat dissipative.

9. The apparatus of claim 1 wherein each of said mirrors is cylindrical.

10. The apparatus of claim 1 wherein each of said mirrors is aspheric.

11. The apparatus of claim 1 further comprising:
a housing, including a bottom housing mounting surface;

wherein said mounting block is mounted to said bottom housing mounting surface, and;

wherein said plurality of mirrors is mounted to said bottom housing mounting surface.

12. The apparatus of claim 1 further comprising a plurality of fast axis collimators each optically coupled to a corresponding one of said plurality of diode lasers.

13. The apparatus of claim 1 further comprising a focusing optic for focusing the stacked arrangement of diode laser beams.

14. The apparatus of claim 13 further comprising a module output optically coupled to said focusing optic, wherein the stacked arrangement of diode laser beams is capable of becoming focused into said module output.

15. The apparatus of claim 14 wherein said module output is an optical fiber, a beam homogenization rod, beam homogenization optics, or free-space beam delivery optics.

16. The apparatus of claim 1 wherein said plurality of mirrors provides correction for off-axis aberrations.

17. A laser diode apparatus comprising:
a mounting block;
a plurality of diode lasers, each mounted to said mounting block and each capable of emitting a respective diode laser beam; and
a plurality of mirrors each for providing slow axis collimation and reflective direction of an incident corresponding one diode laser beam, each one of said plurality of mirrors optically coupled to at least one respective diode laser of said plurality of diode lasers and optically oriented therewith so as to be capable of reflectively providing the diode laser beams in a stacked arrangement;
wherein each of said mirrors includes an anti-reflective front surface and a highly reflective back-surface and an interior propagation region.

18. A laser diode apparatus comprising:
a mounting block;
a plurality of diode lasers, each mounted to said mounting block and each capable of emitting a respective diode laser beam; and
a plurality of mirrors each for providing slow axis collimation and reflective direction of an incident corresponding one diode laser beam, each one of said plurality of mirrors optically coupled to at least one respective diode laser of said plurality of diode lasers and optically oriented therewith so as to be capable of reflectively providing the diode laser beams in a stacked arrangement;
wherein each of said mirrors includes two cylindrical cuts defining a front surface and said reflective back surface, said front surface including one or more anti-reflection coatings applied thereto, said reflective back surface including one or more high reflection coatings applied thereto, and wherein said anti-reflection and high reflection coatings significantly reduce optical aberrations.

* * * * *